United States Patent
Mizuno et al.

(10) Patent No.: US 11,006,555 B2
(45) Date of Patent: May 11, 2021

(54) SHIELD MEMBER, SHIELD MEMBER-ATTACHED ELECTRIC WIRE, INTERMEDIATE PRODUCT FOR SHIELD MEMBER, AND METHOD FOR PRODUCING SHIELD MEMBER

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Housei Mizuno, Mie (JP); Hidetoshi Ishida, Mie (JP); Yasuyuki Yamamoto, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/319,021

(22) PCT Filed: Jul. 10, 2017

(86) PCT No.: PCT/JP2017/025105
§ 371 (c)(1),
(2) Date: Jan. 18, 2019

(87) PCT Pub. No.: WO2018/016363
PCT Pub. Date: Jan. 25, 2018

(65) Prior Publication Data
US 2019/0239398 A1  Aug. 1, 2019

(30) Foreign Application Priority Data
Jul. 19, 2016 (JP) .............................. JP2016-141287

(51) Int. Cl.
*H05K 9/00* (2006.01)
*H02G 3/04* (2006.01)
(Continued)

(52) U.S. Cl.
CPC ........... *H05K 9/0098* (2013.01); *H01B 9/028* (2013.01); *H01B 11/1091* (2013.01);
(Continued)

(58) Field of Classification Search
None
See application file for complete search history.

(56) References Cited

U.S. PATENT DOCUMENTS 2,663,752 A * 12/1953 Wier ...................... H01B 9/024
174/36
3,351,706 A * 11/1967 Gnerre ................... H01B 9/025
174/105 R
(Continued)

FOREIGN PATENT DOCUMENTS

JP 57-053525 * 3/1982
JP 2000-030943 * 1/2000
(Continued)

OTHER PUBLICATIONS

Official Communication issued in International Bureau of WIPO Patent Application No. PCT/JP2017/025105, dated Oct. 10, 2017.

*Primary Examiner* — Binh B Tran
*Assistant Examiner* — Muhammed Azam
(74) *Attorney, Agent, or Firm* — Greenblum & Bernstein, P.L.C.

(57) ABSTRACT

A shield member that includes a drain wire with a free end portion by cutting a long drain wire-attached shield member to a desired length. The shield member includes a shield portion and a drain wire. The shield portion can shield an electric wire. The drain wire includes a holding portion
(Continued)

provided between a first end and a second end of the shield portion and held in the shield portion; and an extension portion that is continuous with the holding portion and extends outward from the shield portion. At least a portion of the holding portion extends between the first end and the second end of the shield portion while having excess length.

10 Claims, 3 Drawing Sheets

(51) Int. Cl.
  *H01B 9/02* (2006.01)
  *H01B 11/10* (2006.01)
  *H01B 13/22* (2006.01)
  *B60R 16/02* (2006.01)
(52) U.S. Cl.
  CPC ........... *H01B 13/22* (2013.01); *H02G 3/0462* (2013.01); *H05K 9/009* (2013.01); *H05K 9/0088* (2013.01); *B60R 16/0215* (2013.01)

(56) References Cited

U.S. PATENT DOCUMENTS

| | | | | | |
|---|---|---|---|---|---|
| 3,474,189 | A * | 10/1969 | Arnaudin, Jr. | .......... | H01B 9/028 174/115 |
| 3,639,674 | A * | 2/1972 | Stier | ........... | H01B 9/02 174/36 |
| 3,646,248 | A * | 2/1972 | Ling | .......... | H01B 7/02 174/120 SC |
| 3,666,877 | A * | 5/1972 | Arnaudin, Jr. | .......... | H01B 9/026 174/115 |
| 3,673,315 | A * | 6/1972 | Lasley | ................... | H01B 9/022 174/107 |
| 3,705,257 | A * | 12/1972 | Wade | ........... | H01B 7/29 174/115 |
| 3,707,595 | A * | 12/1972 | Plate | .......... | H01B 9/02 174/115 |
| 3,728,474 | A * | 4/1973 | Amaudin, Jr. | .......... | H01B 9/026 174/115 |
| 3,735,025 | A * | 5/1973 | Ling | .......... | H01B 1/24 174/120 SC |
| 3,849,591 | A * | 11/1974 | Ichiba | .................... | D07B 1/162 174/107 |
| 3,896,261 | A * | 7/1975 | Cole | ................ | H01B 11/1808 174/115 |
| 3,917,900 | A * | 11/1975 | Amaudin, Jr. | .......... | H01B 7/202 174/107 |
| 3,927,247 | A * | 12/1975 | Timmons | ........... | H01B 11/1808 174/36 |
| 3,935,375 | A * | 1/1976 | Ichiba | .................... | B32B 15/08 174/102 R |
| 3,983,313 | A * | 9/1976 | Ney | .......... | H01B 3/24 174/121 SR |
| 4,096,346 | A * | 6/1978 | Stine | .......... | F16L 11/06 174/36 |
| 4,323,721 | A * | 4/1982 | Kincaid | ................ | H01B 11/06 174/103 |
| 4,327,246 | A * | 4/1982 | Kincaid | ............. | H01B 11/1025 174/105 R |
| 4,360,395 | A * | 11/1982 | Suzuki | ................ | H01B 13/266 156/201 |
| 4,374,299 | A * | 2/1983 | Kincaid | ............. | H01B 11/1091 174/106 R |
| 4,442,314 | A * | 4/1984 | Piper | ................ | H01B 11/1091 139/425 R |
| 4,469,538 | A * | 9/1984 | Wade | .......... | H01B 1/24 156/298 |
| 4,469,539 | A * | 9/1984 | Wade | .......... | H01B 1/24 156/298 |
| 4,472,595 | A * | 9/1984 | Fox | .......... | H01B 11/1878 174/36 |
| 4,486,252 | A * | 12/1984 | Lloyd | ................ | H01B 11/1058 156/298 |
| 4,510,346 | A * | 4/1985 | Bursh, Jr. | .......... | H01B 11/1091 174/106 R |
| 4,629,827 | A * | 12/1986 | Baxter | .................... | H01B 13/24 174/102 D |
| 4,800,236 | A * | 1/1989 | Lemke | ................. | H01B 11/085 174/36 |
| 4,883,922 | A * | 11/1989 | Yokota | ................... | H01L 39/143 505/211 |
| 4,988,833 | A * | 1/1991 | Lai | ......... | H01B 7/065 174/69 |
| 5,012,045 | A * | 4/1991 | Sato | ................... | H01B 11/1033 174/106 R |
| 5,107,076 | A * | 4/1992 | Bullock | .................... | H01B 7/38 174/107 |
| 5,119,046 | A * | 6/1992 | Kozlowski, Jr. | ........ | H01B 7/363 174/112 |
| 5,132,489 | A * | 7/1992 | Yamano | ................ | H01B 7/0861 174/112 |
| 5,132,491 | A * | 7/1992 | Mulrooney | ........ | H01B 11/1826 174/105 SC |
| 5,171,938 | A * | 12/1992 | Katsumata | ............... | H01B 7/08 174/105 SC |
| 5,455,383 | A * | 10/1995 | Tanaka | ................. | H01B 7/0861 174/117 A |
| 5,457,287 | A * | 10/1995 | Shimozawa | ........ | H01B 11/1821 174/102 R |
| 5,530,203 | A * | 6/1996 | Adams | ................... | H01B 9/003 174/106 R |
| 5,565,653 | A * | 10/1996 | Rofidal | .................. | H01B 11/02 174/113 R |
| 5,666,452 | A * | 9/1997 | Deitz, Sr. | ............... | G02B 6/441 174/24 |
| 5,807,447 | A * | 9/1998 | Forrest | ................... | H01B 9/028 156/244.12 |
| 5,930,100 | A * | 7/1999 | Gasque, Jr. | ........ | H01B 11/1091 174/108 |
| 5,939,668 | A * | 8/1999 | De Win | ............. | H01B 11/1091 174/106 R |
| 5,956,445 | A * | 9/1999 | Deitz, Sr. | ................ | G02B 6/441 174/24 |
| 6,118,070 | A * | 9/2000 | Tamura | ................ | H04B 5/0018 174/36 |
| 6,259,019 | B1 * | 7/2001 | Damilo | ............. | H01B 11/1016 174/102 R |
| 6,278,599 | B1 * | 8/2001 | Gasque, Jr. | ........ | H01B 11/1091 174/108 |
| 6,444,902 | B1 * | 9/2002 | Tsao | ..................... | H01B 7/0861 174/113 R |
| 6,504,379 | B1 * | 1/2003 | Jackson | ............... | H01B 7/0861 174/117 F |
| 6,531,658 | B2 * | 3/2003 | Tanaka | ................. | H01B 7/0861 174/117 F |
| 6,686,537 | B1 * | 2/2004 | Gareis | .................... | H01B 7/292 174/110 R |
| 6,781,061 | B2 * | 8/2004 | Tanaka | ................. | H01B 7/0861 174/117 F |
| 6,803,518 | B2 * | 10/2004 | Chang | .................. | H01B 11/002 174/113 R |
| 6,977,344 | B2 * | 12/2005 | Tanaka | ................. | H01B 7/0861 174/117 F |
| 7,361,831 | B2 * | 4/2008 | Tanaka | ................. | H01B 11/1804 174/28 |
| 7,479,601 | B1 * | 1/2009 | Cases | .................... | H01B 11/203 174/102 R |
| 7,700,881 | B2 * | 4/2010 | Watanabe | ................ | H01B 7/16 174/110 R |
| 8,039,749 | B2 * | 10/2011 | Okano | ............... | H01B 11/1008 174/113 R |
| 8,045,565 | B1 * | 10/2011 | Schurig | ................ | H02G 1/06 333/101 |
| 8,258,402 | B2 * | 9/2012 | Hagi | ................ | H01R 4/726 174/840 |
| 9,620,262 | B1 * | 4/2017 | Salz | ............... | H01B 7/0892 |
| 9,799,429 | B2 * | 10/2017 | Adams | ............... | H01B 11/1856 |

(56) References Cited

U.S. PATENT DOCUMENTS

| | | | |
|---|---|---|---|
| 9,809,180 B2* | 11/2017 | Kuroishi | B60R 16/0215 |
| 10,096,953 B1* | 10/2018 | Finnestad | H01R 13/658 |
| 10,424,420 B1* | 9/2019 | Farkas | H01B 13/0036 |
| 2002/0051331 A1* | 5/2002 | Gasque, Jr. | H01B 11/1091 |
| | | | 361/117 |
| 2002/0062979 A1* | 5/2002 | Murakami | H01B 7/0861 |
| | | | 174/117 F |
| 2002/0084088 A1* | 7/2002 | Tanaka | H01B 7/0861 |
| | | | 174/36 |
| 2002/0195260 A1* | 12/2002 | Marks | H05K 9/0098 |
| | | | 174/351 |
| 2003/0146015 A1* | 8/2003 | Tanaka | H01B 7/0861 |
| | | | 174/117 F |
| 2004/0026101 A1* | 2/2004 | Ochi | H01B 11/002 |
| | | | 174/36 |
| 2011/0083877 A1* | 4/2011 | Sugiyama | H01B 7/0823 |
| | | | 174/115 |
| 2011/0232941 A1* | 9/2011 | Sugiyama | H01B 11/203 |
| | | | 174/250 |
| 2011/0247856 A1* | 10/2011 | Matsuda | H01B 11/203 |
| | | | 174/108 |
| 2012/0145429 A1* | 6/2012 | Nordin | H01B 11/203 |
| | | | 174/34 |
| 2012/0298395 A1* | 11/2012 | Gundel | H01R 13/5845 |
| | | | 174/105 R |
| 2013/0032393 A1* | 2/2013 | Toyama | B60R 16/0215 |
| | | | 174/72 A |
| 2013/0146326 A1* | 6/2013 | Gundel | H01B 7/0861 |
| | | | 174/102 R |
| 2013/0269971 A1* | 10/2013 | Yukawa | H01B 19/00 |
| | | | 174/102 C |
| 2014/0027151 A1* | 1/2014 | Huang | H01B 11/1025 |
| | | | 174/109 |
| 2014/0220798 A1* | 8/2014 | Putt, Jr. | H01R 13/65914 |
| | | | 439/95 |
| 2014/0273594 A1* | 9/2014 | Jones | H01R 13/113 |
| | | | 439/357 |
| 2016/0021799 A1* | 1/2016 | Harris | H05K 9/009 |
| | | | 174/350 |
| 2016/0309626 A1* | 10/2016 | Simoens-Seghers | D03D 1/0035 |
| 2017/0133125 A1* | 5/2017 | Janssen | H01B 11/203 |
| 2017/0231124 A1* | 8/2017 | Kobayashi | H05K 9/0098 |
| 2017/0231125 A1* | 8/2017 | Urashita | H01B 7/18 |
| 2017/0302010 A1* | 10/2017 | Urashita | H01R 13/65912 |
| 2018/0047479 A1* | 2/2018 | Hansen | H01B 7/0216 |
| 2018/0075948 A1* | 3/2018 | Kobayashi | H01B 7/29 |
| 2018/0090243 A1* | 3/2018 | Farkas | H01B 11/1895 |
| 2018/0096755 A1* | 4/2018 | Tsujino | H01B 11/002 |
| 2018/0274170 A1* | 9/2018 | Falkenberg | D07B 7/02 |
| 2018/0301247 A1* | 10/2018 | Kobayashi | H01B 7/0869 |
| 2019/0239398 A1* | 8/2019 | Mizuno | H02G 3/0462 |
| 2020/0098490 A1* | 3/2020 | Casher | H01B 7/0807 |

FOREIGN PATENT DOCUMENTS

| | | |
|---|---|---|
| JP | 2001-291435 | 10/2001 |
| JP | 2004-355839 | 12/2004 |
| JP | 2008-198577 | 8/2008 |
| JP | 2014-067521 | 4/2014 |

* cited by examiner

SHIELD MEMBER, SHIELD MEMBER-ATTACHED ELECTRIC WIRE, INTERMEDIATE PRODUCT FOR SHIELD MEMBER, AND METHOD FOR PRODUCING SHIELD MEMBER

TECHNICAL FIELD

The present invention relates to a technique for shielding an electric wire.

BACKGROUND ART

Patent Document 1 discloses a wire harness in which a plurality of electric wires of a low-voltage system circuit and a plurality of electric wires of a high-voltage system circuit are provided separately, and the plurality of electric wires of the low-voltage system circuit and the plurality of electric wires of the high-voltage system circuit are sheathed using an insulating sheet and a shield sheet that are folded so as to separately envelop the entire outer circumference of the plurality of electric wires of the low-voltage system circuit and the plurality of electric wires of the high-voltage system circuit, whereby it is possible to prevent electromagnetic noise generated by the electric wires of the high-voltage system circuit from negatively affecting the low-voltage system circuit.

CITATION LIST

Patent Document
Patent Document 1: JP 2004-355839A

SUMMARY OF INVENTION

Technical Problem

The shield sheet disclosed in Patent Document 1 is grounded by a ground wire (also referred to as a "drain wire"). Here, a drain wire-attached shield member may be produced by cutting a long drain wire-attached shield member to a desired adjusted length. In this case, after the shield member has been cut, the drain wire is held in the shield layer, and it is difficult to ground the shield sheet. For this reason, an end portion of the drain wire may be made free to facilitate connection by cutting the long drain wire-attached shield member to a length longer than the desired length and removing only an end portion of the shield portion while leaving the drain wire. However, in this case, the production yield deteriorates by an amount corresponding to the amount the shield layer is cut.

Accordingly, it is an object of the present invention to provide a technique with which it is possible to improve the production yield of a shield member including a drain wire with a free end portion by cutting a long drain wire-attached shield member to a desired length.

Solution to Problem

In order to solve the problem described above, a shield member according to a first aspect includes: a shield portion that can shield an electric wire; and a drain wire that includes a holding portion provided between a first end and a second end of the shield portion and held in the shield portion, and an extension portion continuous with the holding portion and extending outward from the shield portion, and in which at least a portion of the holding portion extends between the first end and the second end of the shield portion while having excess length.

A shield member according to a second aspect is the shield member according to the first aspect, wherein the shield portion is formed using an electroconductive non-woven fabric as a material thereof, and the holding portion is passed through the non-woven fabric.

A shield member according to a third aspect is the shield member according to the first aspect, wherein the shield portion is formed by stacking a plurality of substrates including a shield material, and the holding portion is sandwiched between the plurality of substrates.

A shield member according to a fourth aspect is the shield member according to any one of the first to third aspects, wherein the holding portion extends in an undulating manner, and thus has excess length.

A shield member-attached electric wire according to a fifth aspect includes: the shield member according to any one of the first to fourth aspects; and an electric wire covered by the shield member.

An intermediate product for a shield member according to a sixth aspect includes: a shield portion that can shield an electric wire; and a drain wire that is provided between a first end and a second end of the shield portion, the drain wire extending between the first end and the second end of the shield portion while having excess length and being held in the shield portion such that an end portion of the drain wire can be drawn outward from the shield portion.

A method for producing a shield member according to a seventh aspect includes the steps of: (a) preparing a long shield member that includes a shield portion and a drain wire that is provided between a first end and a second end of the shield portion and extends between the first end and the second end of the shield portion while having excess length; (b) cutting the long shield member to a desired length so as to produce an intermediate product; and (c) drawing an end portion of the drain wire out of the intermediate product outward from the shield portion.

Advantageous Effects of Invention

According to the first to fourth aspects, the extension portion can be formed by drawing the drain wire from the holding portion outward of the shield portion. Accordingly, when producing a shield member including a drain wire with a free end portion by cutting a long drain wire-attached shield member to a desired length, it is unnecessary to remove the shield portion while leaving only the drain wire, and thus the production yield can be improved.

In particular, according to the second aspect, normally, in a non-woven fabric, there are interstices between fibers, and thus by routing the drain wire through the interstices, the drain wire can be placed so as to extend along the shield portion while being connected to the shield portion.

In particular, according to the third aspect, because the drain wire is sandwiched between a plurality of substrates, the drain wire can be easily placed so as to extend along the shield portion while being connected to the shield portion.

In particular, according to the fourth aspect, it is possible to easily provide a structure with excess length. Also, the drain wire can be easily drawn out from the holding portion.

In particular, according to the fifth aspect, at least a portion of the holding portion extends between the first end and the second end of the shield portion while having excess length, and it is therefore possible to draw the drain wire from the holding portion outward of the shield portion.

Accordingly, when producing a shield member including a drain wire with a free end portion by cutting a long drain wire-attached shield member to a desired length, it is unnecessary to remove the shield portion while leaving only the drain wire, and thus the production yield can be improved.

In particular, according to the sixth aspect, the drain wire extends between the first end and the second end of the shield portion while having excess length and is held in the shield portion such that an end portion of the drain wire can be drawn outward from the shield portion, and thus the drain wire can be drawn outward of the shield portion. Accordingly, when producing a shield member including a drain wire with a free end portion by cutting a long drain wire-attached shield member to a desired length, it is unnecessary to remove the shield portion while leaving only the drain wire, and thus the production yield can be improved.

In particular, according to the seventh aspect, the method includes a step of drawing the drain wire outward of the shield portion from an intermediate product with a desired length obtained through cutting. Accordingly, in the intermediate product, it is unnecessary to remove the shield portion while leaving only the drain wire, and thus the production yield can be improved.

DESCRIPTION OF EMBODIMENT

Embodiment

Hereinafter, a description will be given of a shield member, a shield member-attached electric wire, an intermediate product for a shield member, and a method for producing a shield member according to an embodiment.

Figure 1:
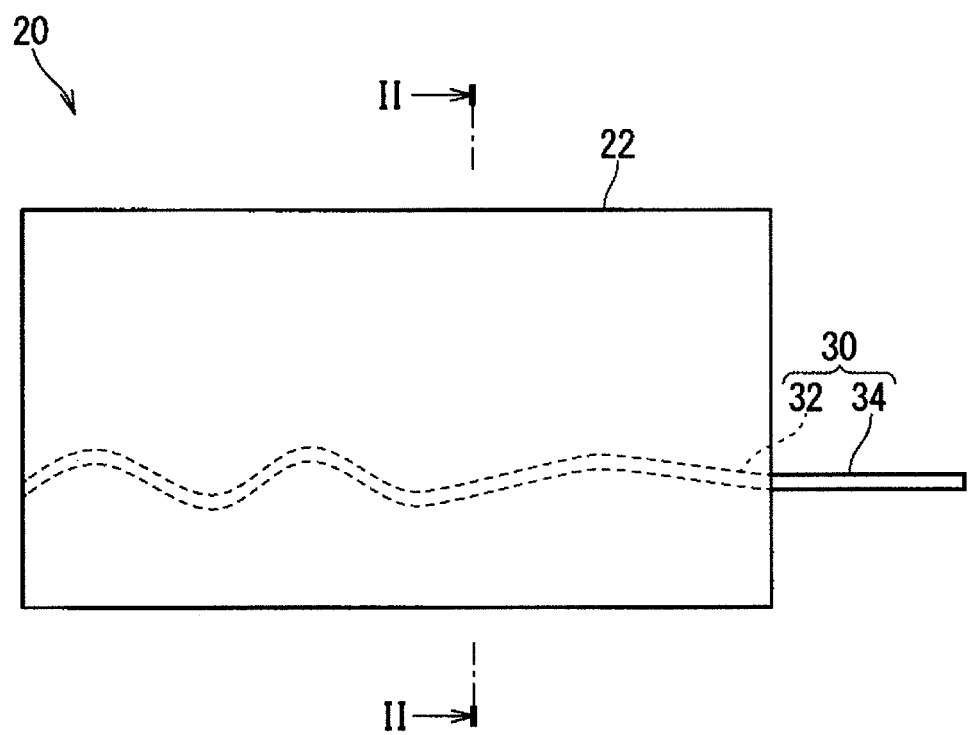
FIG. 1 is a plan view of a shield member according to an embodiment.
Figure 2:
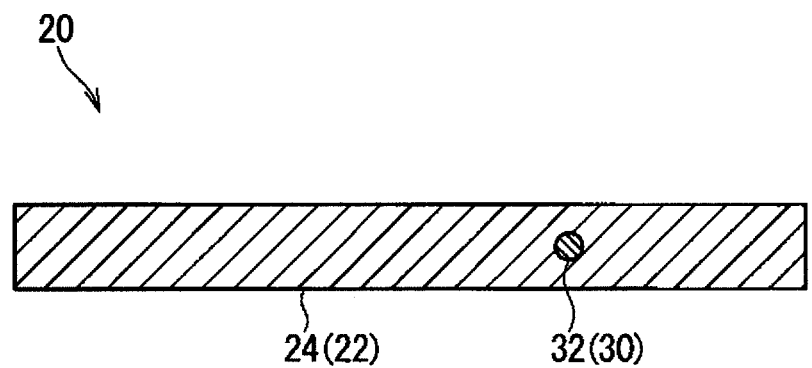
FIG. 2 is a cross-sectional view taken along the line II-II shown in FIG. 1.

First, a shield member according to an embodiment will be described. FIG. 1 is a plan view of a shield member 20 according to the embodiment. FIG. 2 is a cross-sectional view taken along the line II-II shown in FIG. 1.

Figure 3:
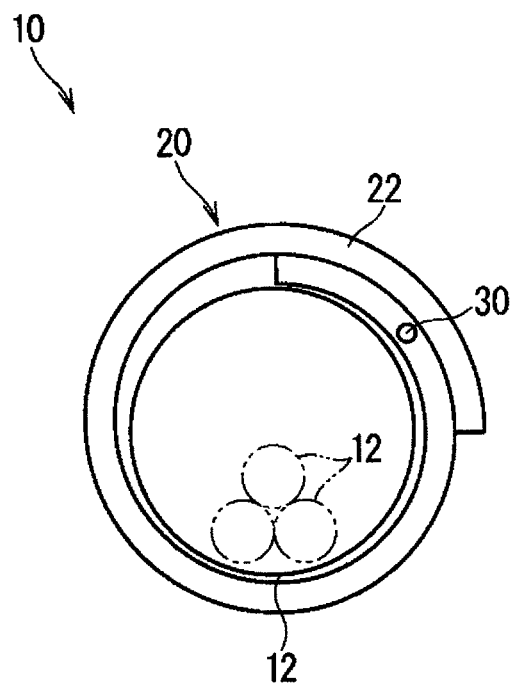
FIG. 3 is a front view of a shield member-attached electric wire according to an embodiment.

The shield member 20 is a member that covers an electric wire 12 and shields the electric wire 12 (see FIG. 3). The shield member 20 includes a shield portion 22 and a drain wire 30.

The shield portion 22 is formed so as to be capable of shielding the electric wire 12. That is, the shield portion 22 is formed such that an electroconductive member can cover the electric wire 12. The length and the width of the shield portion 22 are set as appropriate according to the electric wire 12 to which the shield portion 22 is to be attached. This example will be described assuming that the shield portion 22 is formed using an electroconductive non-woven fabric 24 as a material thereof.

For example, a known electroconductive non-woven fabric 24 including resin fibers and metal fibers can be used as the non-woven fabric 24. Here, the metal fibers may be fibers only made of metal, or fibers other than metal fibers such as resin fibers, with metal plating. The ratio of the resin fibers and the metal fibers that constitute the non-woven fabric 24 is set as appropriate according to the shielding properties, ease of production, and the like. There is no particular limitation on the method for forming a web and the method for bonding webs together, the web being an intermediate product for forming the non-woven fabric 24. The method for forming a web may be a dry method, a wet method, or a spunbonding method. The method for bonding webs together may be, for example, a needle punching method, or a thermal bonding method in which the resin fibers described above are made of a thermal adhesive resin, and functions as a binder that adhesively bonds fibers together. As will be described later, in this example, the drain wire 30 is routed in the non-woven fabric 24, and it is therefore preferable that the non-woven fabric 24 is a non-woven fabric in which the drain wire 30 routed therein is more reliably connected to the metal fibers. Such a non-woven fabric is formed by, for example, bonding a web made of resin fibers and a web made of metal fibers using a needle punching method. In this case, the fibers become entangled and bond to each other without the resin fibers adhering to each other, and thus the drain wire and the metal fibers can be more reliably electrically connected to each other.

This example will be described assuming that the shield portion 22 is formed in the form of a sheet. Normally, the non-woven fabric 24 is produced in the form of a sheet. Accordingly, in this example, a non-woven fabric 24 produced in the form of a sheet can be used as the shield portion 22. However, the shield portion 22 may be formed in a cylindrical shape or the like. For example, the shield portion can be formed in a cylindrical shape by deforming a non-woven fabric 24 in the form of a sheet into a cylindrical shape and heat pressing the non-woven fabric 24.

The drain wire 30 is a member for grounding the shield portion 22. Accordingly, the drain wire 30 includes a conductor wire, and a portion of the drain wire 30 is connected to the shield portion 22. In this example, the drain wire 30 is a linear conductor without a coating, or in other words, a bare conductor wire. Normally, the drain wire 30 is a twisted wire in which a plurality of thin strands are twisted together, but the drain wire 30 may be a single wire. For example, a ground terminal may be connected to an end portion of the drain wire 30 so as to connect the drain wire 30 to ground via the ground terminal. Specifically, the drain wire 30 includes a holding portion 32 and an extension portion 34.

The holding portion 32 is provided between a first end and a second end of the shield portion 22. In this example, the holding portion 32 is present over the entire region extending from the first end to the second end of the shield portion 22. However, the holding portion 32 may be present in a region extending from the first end to the center of the shield portion 22.

The holding portion 32 is held in the shield portion 22. In this example, the holding portion 32 is held while being electrically connected to the shield portion 22. At this time, the holding portion 32 may or may not be joined to the shield portion 22. Also, in this example, the holding portion 32 is passed through the non-woven fabric 24. The holding portion 32 is held in the shield portion 22 without being joined to the shield portion 22 while being electrically connected to the shield portion 22 by, for example, passing the drain wire 30 through the non-woven fabric 24 whose fibers are relatively densely entangled with each other, or by heat pressing and compressing the non-woven fabric 24 through which the drain wire 30 is passed.

At least a portion of the holding portion 32 extends between the first end and the second end of the shield portion 22 while having excess length. In this example, the holding portion 32 extends in an undulating manner, and thereby has excess length. While this is described later, the shield member 20 is produced by drawing the drain wire 30 out from an intermediate product 21 (see FIG. 5) in which the drain wire 30 does not extend outward from the shield portion 22. At this time, the drain wire 30 has excess length in the intermediate product 21, and the drain wire 30 is drawn out using the excess length. The excess length of the holding portion 32 in the shield member 20 is a portion not used when the drain wire 30 is drawn out from the intermediate product 21. That is, it can be said that the excess length in the shield member 20 is an indicator indicating that the shield member 20 was produced from the intermediate product 21.

In the example shown in FIG. 1, the extension portion 34 extends from the first end side of the shield portion 22. That is, the drain wire 30 is drawn out from the first end side of the shield portion 22. Accordingly, the height of the undulating shape is reduced on the first end side as compared with that on the second end side, and the excess length is smaller on the first end side.

The extension portion 34 is continuous with the holding portion 32 and extends outward from the shield portion 22. In this example, the extension portion 34 extends only from the first end portion of the holding portion 32. However, the extension portion 34 may also be drawn out from the second end side. In this case, the extension portion on the second end side may be joined and electrically connected to a member that requires ground connection. The length of the extension portion is set as appropriate according to the distance from the position at which the shield member 20 is provided to the position at which the shield member 20 is to be grounded, or the like.

Next, a shield member-attached electric wire 10 will be described. FIG. 3 is a front view of a shield member-attached electric wire 10 according to an embodiment.

The shield member-attached electric wire 10 includes a shield member 20 as described above and an electric wire 12 covered by the shield member 20. In this example, the shield portion 22 of the shield member 20 is formed in the form of a sheet, and thus the shield member 20 is wound around the electric wire 12, and thereby covers the electric wire 12.

The electric wire 12 includes at least one electric wire. This example will be described assuming that the electric wire 12 is composed of a bundle of electric wires 12. However, the electric wire 12 may be a so-called twisted electric wire in which a plurality of electric wires 12 are twisted together. In a state in which the shield member-attached electric wire 10 is installed in a vehicle, the electric wires 12 are connected to various types of electric components mounted on the vehicle via connectors provided at end portions of the electric wires 12. The shield member-attached electric wire 10 thereby functions to electrically connect the various types of electric components mounted on the vehicle. The electric wires 12 included in the shield member-attached electric wire 10 are bundled according to the installation path in the vehicle.

Production Method

Figure 4:
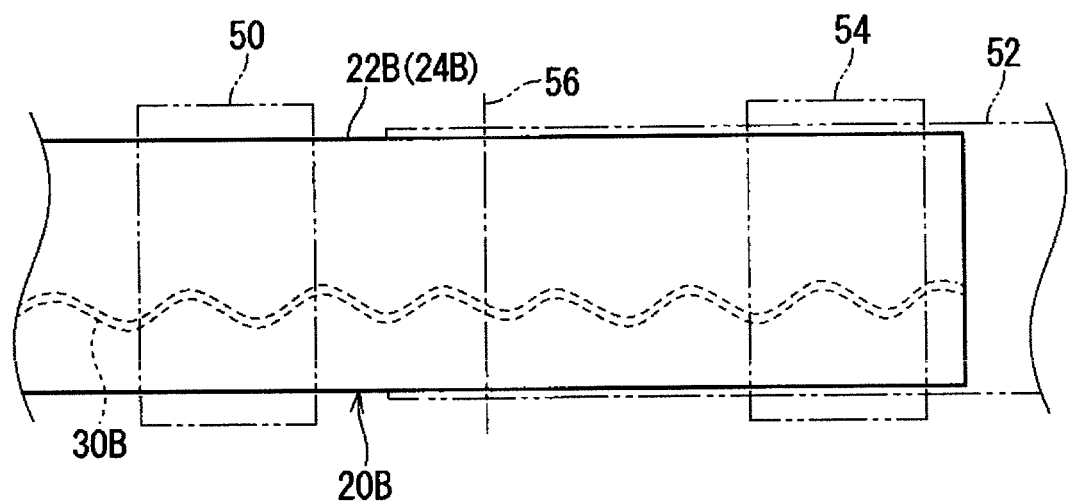
FIG. 4 is a diagram illustrating a method for producing a shield member according to an embodiment.
Figure 5:
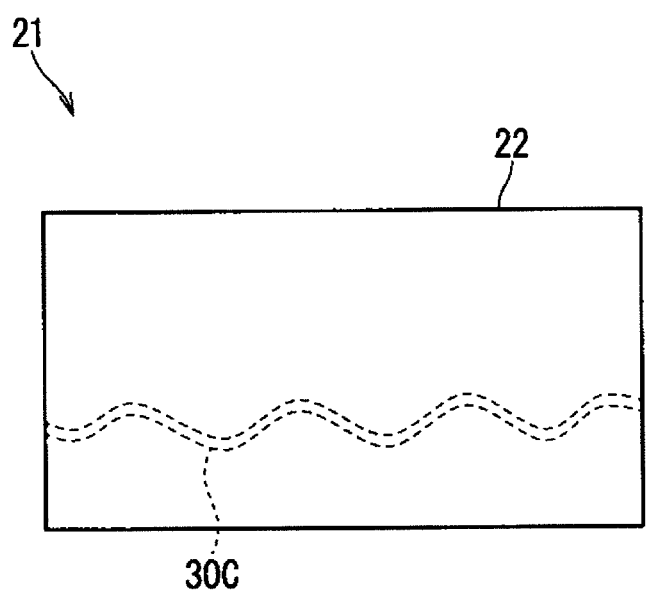
FIG. 5 is a plan view of an intermediate product for a shield member according to an embodiment.

Next, a description will be given of a method for producing the shield member 20, and an intermediate product 21 produced in the method. FIG. 4 is a diagram illustrating the method for producing the shield member 20 according to the embodiment. FIG. 5 is a plan view of the intermediate product 21 for the shield member 20 according to the embodiment.

First, a long shield member 20B is prepared that includes a shield portion 22B and a drain wire 30B that is provided between a first end and a second end of the shield portion 22B, and extends between the first end and the second end of the shield portion 22B while having excess length (step (a)). The long shield member 20B is provided with the drain wire 30B spanning the entire long non-woven fabric 24B. The drain wire 30B extends in an undulating manner, and thus has excess length. At this time, a drain wire 30B that has an undulating shape may be provided, or a drain wire 30B that does not have an undulating shape may be provided. In the case where a drain wire 30B that does not have an undulating shape is provided as the drain wire 30B, the drain wire 30B may be deformed into an undulating shape and held in the shield portion 22B. The pitch, height, and the like of the undulating shape may be set to any value as appropriate, and the length of the excess length can be changed by changing these values. Also, the force with which the shield portion 22B holds the drain wire 30B is a force with which, in a state in which an intermediate product 21 with a desired length is obtained through cutting, the drain wire 30 can be drawn out from the shield portion 22 by grasping and pulling an end portion of the drain wire 30. The long shield member 20B is, for example, stored wrapped around a drum (not shown in the diagrams) or the like.

Next, the long shield member 20B is cut to a desired length so as to produce an intermediate product 21 (step (b)). Specifically, the long shield member 20B stored wrapped around a drum or the like is conveyed while being sandwiched between a pair of rollers 50 or the like. At this time, the rollers 50 may be provided with a rotary encoder or the like to adjust the long shield member 20B to a desired length. A portion of the long shield member 20B conveyed toward the downstream side of the rollers 50 is transferred by a belt conveyor 52 or the like, and at the same time, the leading end of the long shield member 20B is sandwiched between another pair of rollers 54. In this state, a portion of the long shield member 20B between the rollers 50 and 54 is cut using a cutting blade 56 or the like. Through this process, an intermediate product 21 with a desired length as shown in FIG. 5 can be obtained.

Accordingly, the intermediate product 21 for the shield member 20 includes a shield portion 22 that can shield an electric wire 12 and a drain wire 30C that is provided between a first end and a second end of the shield portion 22, and extends between the first end and the second end of the shield portion 22 while having excess length. The drain wire 30C does not include an extension portion 34 as described above. Also, the drain wire 30C has an excess length larger than the holding portion 32.

At this time, the drain wire 30C in the intermediate product 21 is held in the shield portion 22 such that an end portion of the drain wire 30C can be drawn outward from the shield portion 22. That is, the drain wire 30C in the intermediate product 21 is held in the shield portion 22 with a force with which the drain wire 30C can be drawn outward from the shield portion 22 by an operator, a robot hand, or the like grasping and pulling an end portion of the drain wire 30C. This configuration can be realized by, for example, the drain wire 30C being held in the shield portion 22 without being joined to the shield portion 22, or the drain wire 30C being joined to the shield portion 22 with a weak force.

Next, an end portion of the drain wire 30C in the intermediate product 21 is drawn outward from the shield portion 22 so as to form an extension portion 34 (step (c)). The drain wire 30C can be drawn outward from the shield portion 22 by, for example, an operator, a robot hand, or the like grasping and pulling an end portion of the drain wire 30C. At this time, the excess length of the drain wire 30C is shortened, and the portion of the drain wire 30C that has been drawn out functions as the extension portion 34, and the portion of the drain wire 30C remaining in the shield portion 22 functions as the holding portion 32. As described above, in this example, the drain wire 30C is drawn out only from the first end side of the shield portion 22, but the drain wire 30C may also be drawn out from the second end side. Also, after the drain wire 30C has been drawn out to a desired length, and the extension portion 34 with a desired length has been formed, the periphery of the connecting portion between the holding portion 32 and the extension portion 34 may be joined to the shield portion 22 so as to prevent the drain wire 30 from being further drawn out. Depending on the length of the extension portion 34, the entire excess length of the drain wire 30C may be drawn out from the shield portion 22.

As described above, a shield member 20 as described above is obtained by drawing the drain wire 30C out from the intermediate product 21.

With the shield member 20, the shield member-attached electric wire 10, and the intermediate product 21 for the shield member 20 that are configured as described above, and the method for producing a shield member 20, it is possible to provide an extension portion 34 by drawing the drain wire 30 out from the holding portion 32 outward of the shield portion 22. Accordingly, when producing a shield member 20 including a drain wire 30 with a free end portion by cutting a long shield member 20B to a desired length, it is unnecessary to remove the shield portion 22 while leaving only the drain wire 30, and thus the production yield can be improved.

Also, normally, in a non-woven fabric 24, there are interstices between fibers, and thus by routing the drain wire 30 through the interstices, the drain wire 30 can be placed so as to extend along the shield portion 22 while being connected to the shield portion 22.

Also, excess length is provided by extending the holding portion in an undulating manner, and it is therefore possible to easily provide a structure with excess length. Also, the drain wire 30 can be easily drawn out from the holding portion 32.

Variation

Figure 6:
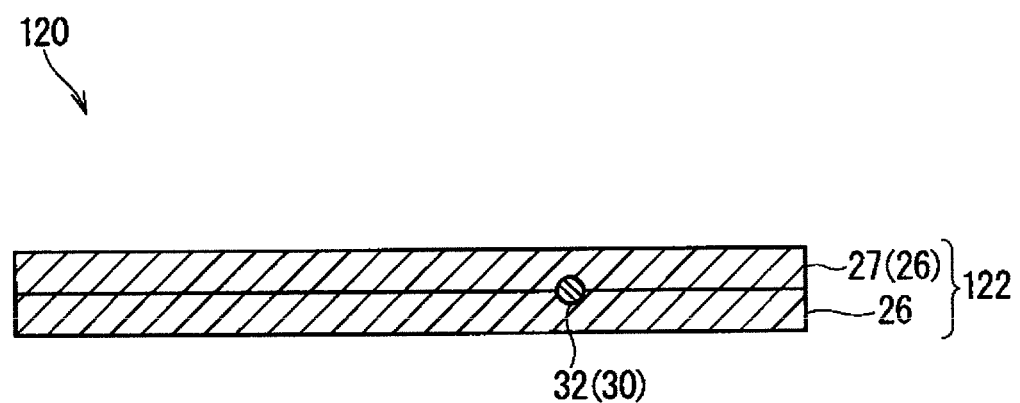
FIG. 6 is a cross-sectional view of a shield member according to a variation.

In the embodiment, an example has been described in which the shield portion 22 is formed using an electroconductive non-woven fabric 24 as a material thereof, and the holding portion 32 is passed through the non-woven fabric 24, but the configuration is not necessarily limited to that described above. As a variation of the shield portion 22, for example, a shield member 20 shown in FIG. 6 may be conceived.

A shield portion 122 of a shield member 120 is formed by stacking a plurality of (two in FIG. 6) substrates 26 including a shield material 27. The shield material 27 is an electroconductive substrate 26. Then, a holding portion 32 of a drain wire 30 is sandwiched between the electroconductive shield material 27 and the other substrate 26. At this time, the drain wire 30 is electrically connected to the electroconductive shield material 27. The electroconductive shield material 27 as described above may be, for example, a metal foil, a sheet material that has metal plating on the surface thereof, or the like. As the other substrate 26, a non-electroconductive material may be used other than the shield material 27. For example, a resin sheet or the like may be used as the substrate 26.

With the shield member 120 described above, because the drain wire 30 is sandwiched between the plurality of substrates 26, the drain wire 30 can be easily placed so as to extend along the shield portion 22 while being connected to the shield portion 22.

Also, in the embodiment, an example has been described in which the excess length is formed by extending the holding portion 32 in an undulating manner, but the configuration is not necessarily limited to that described above. For example, the excess length may be formed by extending the holding portion in a helical manner.

The constituent elements described in the embodiment and the variation given above may be combined as appropriate unless there is no mutual contradiction.

Up to here, the present invention has been described in detail, but the description given above merely illustrates examples in all aspects, and thus the present invention is not limited thereto. It is to be understood that a number of variations that are not described herein are also encompassed within the scope of the present invention without departing from the scope of the present invention.

LIST OF REFERENCE NUMERALS

10 Shield member-attached electric wire
12 Electric wire
20, 120 Shield member
20B Long shield member
21 Intermediate product
22, 22B, 122 Shield portion
24 Non-woven fabric
26 Substrate
27 Shield material
30, 30B, 30C Drain wire
32 Holding portion
34 Extension portion

The invention claimed is:

1. A shield member comprising:
a shield portion configured to shield an electric wire; and
a drain wire that includes a holding portion provided between a first end and a second end of the shield portion and held in the shield portion, and an extension portion continuous with the holding portion and extending outward from the shield portion, wherein at least a portion of the holding portion extends between the first end and the second end of the shield portion while having excess length, and wherein
the drain wire is oriented in a plane within the shield portion, the plane extending generally parallel to an outer planar surface of the shield portion.

2. The shield member according to claim 1,
wherein the shield portion is formed using an electroconductive non-woven fabric as a material thereof, and
the holding portion is passed through the non-woven fabric.

3. The shield member according to claim 1,
wherein the shield portion is formed by stacking a plurality of substrates including a shield material, and
the holding portion is sandwiched between the plurality of substrates.

4. The shield member according to claim 1,
wherein the holding portion extends in an undulating manner, and thus has excess length.

5. A shield member-attached electric wire comprising:
the shield member according to claim 1; and
wherein the electric wire is covered by the shield member.

6. An intermediate product for a shield member, the intermediate product comprising:
a shield portion configured to shield an electric wire; and
a drain wire that is provided between a first end and a second end of the shield portion, the drain wire extending between the first end and the second end of the shield portion while having excess length and being held in the shield portion such that an end portion of the drain wire can be drawn outward from the shield portion, and wherein
the drain wire is oriented in a plane within the shield portion, the plane extending generally parallel to an outer planar surface of the shield portion.

7. A method for producing a shield member according to claim 1, the method comprising
preparing a long shield member that includes the shield portion and the drain wire that is provided between the first end and the second end of the shield portion and extends between the first end and the second end of the shield portion while having excess length;
cutting the long shield member to a desired length so as to produce an intermediate product; and
drawing the end portion of the drain wire out of the intermediate product outward from the shield portion.

8. The shield member according to claim 1, wherein the holding portion of the drain wire is unaffixed to the shield portion.

9. The intermediate product according to claim 6, wherein the drain wire is unaffixed to the shield portion such that the drain wire is movable relative to at least one of the first end and the second end of the shield portion.

10. A shield member comprising:
a shield portion configured to shield an electric wire; and
a drain wire that includes a holding portion provided between a first end and a second end of the shield portion and held in the shield portion, and an extension portion continuous with the holding portion and extending outward from the shield portion, wherein at least a portion of the holding portion extends between the first end and the second end of the shield portion while having excess length, wherein
a state in which the drain wire is held by the shield portion precedes connecting the shield member to the electric wire.

* * * * *